United States Patent
Takahashi et al.

(10) Patent No.: US 10,056,226 B2
(45) Date of Patent: Aug. 21, 2018

(54) CHARGED PARTICLE BEAM APPARATUS AND VIBRATION DAMPER FOR CHARGED PARTICLE BEAM APPARATUS

(71) Applicant: HITACHI HIGH-TECHNOLOGIES CORPORATION, Minato-ku, Tokyo (JP)

(72) Inventors: Motohiro Takahashi, Tokyo (JP); Yoshimasa Fukushima, Tokyo (JP); Katsunori Onuki, Tokyo (JP); Tetsuya Niibori, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 58 days.

(21) Appl. No.: 15/440,327

(22) Filed: Feb. 23, 2017

(65) Prior Publication Data
US 2017/0250054 A1    Aug. 31, 2017

(30) Foreign Application Priority Data
Feb. 26, 2016  (JP) ................... 2016-035027

(51) Int. Cl.
*H01J 1/18* (2006.01)
*H01J 37/20* (2006.01)
*H01J 37/26* (2006.01)

(52) U.S. Cl.
CPC ............ *H01J 37/20* (2013.01); *H01J 37/261* (2013.01)

(58) Field of Classification Search
CPC ........ H01J 3/02; H01J 3/04; H01J 3/06; H01J 5/20; H01J 1/18; H01J 19/12; H01J 2229/0744; H01J 2237/0216; H01J 2237/02
USPC ..... 250/492.1, 492.2, 492.21, 492.23, 492.3, 250/306, 307, 309, 310, 311
See application file for complete search history.

(56) References Cited

U.S. PATENT DOCUMENTS

| | | | |
|---|---|---|---|
| 5,378,984 A * | 1/1995 | Kurata | G01R 31/307 250/311 |
| 6,529,264 B1 | 3/2003 | Ikeda | |
| 8,629,410 B2 | 1/2014 | Tsuji et al. | |
| 8,729,467 B2 | 5/2014 | Tsuji et al. | |
| 2012/0091362 A1* | 4/2012 | Tsuji | F16F 9/306 250/441.11 |
| 2012/0193550 A1* | 8/2012 | Tsuji | F16F 1/50 250/396 R |

FOREIGN PATENT DOCUMENTS

| | | |
|---|---|---|
| JP | 5364462 B2 | 12/2013 |
| JP | 5524229 B2 | 6/2014 |
| WO | WO 99/27570 | 6/1999 |

\* cited by examiner

*Primary Examiner* — Nicole Ippolito
(74) *Attorney, Agent, or Firm* — Miles & Stockbridge P.C.

(57) ABSTRACT

There is proposed a column supporting structure that includes a viscoelastic sheet, a supporting plate which holds the viscoelastic sheet, and a fixation portion which connects the supporting plate to each lens barrel. The viscoelastic sheet is disposed to extend in a plane perpendicular to one lens barrel or the other lens barrel.

8 Claims, 15 Drawing Sheets

WAVEFORM AT FREQUENCY a

WAVEFORM AT FREQUENCY b

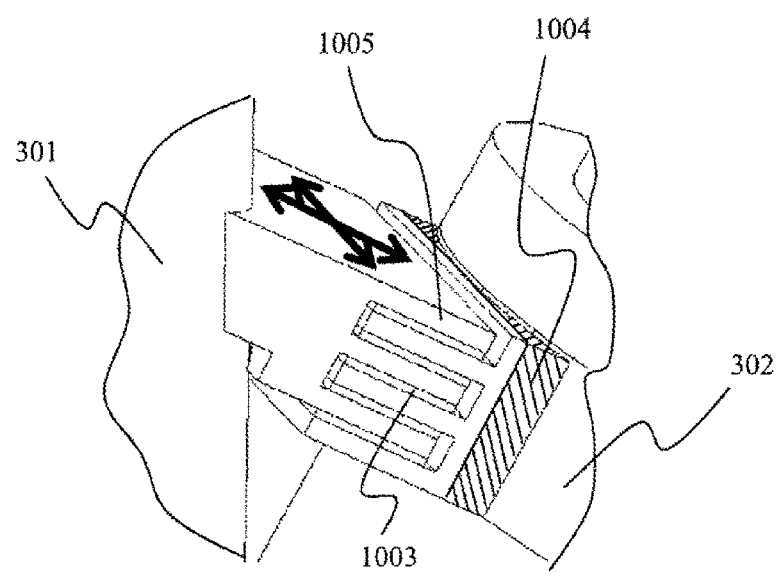
FIG. 10
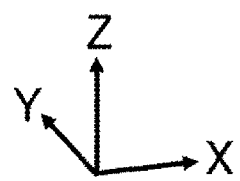

CASE WHERE TWO DAMPING STRUCTURES ARE PROVIDED

CASE WHERE THREE DAMPING STRUCTURES ARE PROVIDED

CHARGED PARTICLE BEAM APPARATUS AND VIBRATION DAMPER FOR CHARGED PARTICLE BEAM APPARATUS

BACKGROUND OF THE INVENTION

Field of the Invention

The present invention relates to vibration suppression of a lens barrel (a column) in a charged particle beam apparatus and particularly relates to a charged particle beam apparatus and a vibration damper for a charged particle beam apparatus with which it is possible to achieve vibration suppression of a plurality of columns.

Background Art

A charged particle beam apparatus such as an electron microscope is an apparatus that irradiates a sample with an electron beam (charged particle beam) and that detects charged particles obtained on the basis of the irradiation. The charged particle beam apparatus is provided with a plurality of optical elements for beam control and a beam passing through the optical elements is converged and deflected. The beam adjusted by the optical elements reaches the sample or a position near the sample and a signal corresponding to the state of a position that the beam reaches is detected by a detector or the like. In order to reduce an influence of vibration on such a charged particle beam apparatus, Japanese Patent No. 5524229 (corresponding to U.S. Pat. No. 8,729,467) discloses a technique of damping vibration of a column by providing a tension rod-shaped structure member, into which a viscoelastic sheet is built, between the column and a top plate. In addition, Japanese Patent No. 5364462 (corresponding to U.S. Pat. No. 8,629,410) discloses a technique in which a structure such as an ion pump that is additionally attached to a column is supported by a pillar with a viscoelastic sheet being interposed therebetween. In addition, WO 99/27570 (corresponding to U.S. Pat. No. 6,529,264) discloses a technique in which each of optical lens barrels, which are disposed to be parallel with each other, is divided into two parts and an optical path between lens barrels is used as a supporting rod between the lens barrels in a semiconductor exposure apparatus.

SUMMARY OF THE INVENTION

As a charged particle beam apparatus, there is an apparatus that includes a plurality of columns mounted therein. For example, there is an apparatus that irradiates a sample with a beam from a first column including a charged particle source and that detects charged particles obtained on the basis of the irradiation with a beam by using a detecting element provided in a second column. In a case where a column vibration control structure disclosed in Japanese Patent No. 5524229 is used to dampen vibration of a charged particle beam apparatus which includes a plurality of columns as described above, it is necessary to increase the number of vibration control structures corresponding to the number of lens barrels and thus the apparatus becomes complicated. In addition, in a case where there are individual differences in degree of attaching adjustment, one column and the other column become different from each other in vibration characteristic. Furthermore, in a case where a vibration control structure disclosed in Japanese Patent No. 5364462 is applied to an apparatus including a plurality of columns, detachment is needed to be performed during maintenance such as baking, in which the temperature of a structure rises, and vibration characteristics and a value related to image jitter may be changed after the maintenance due to a variation in adjustment which occurs at the time of reattachment after the maintenance.

In addition, in a vibration control structure of WO 99/27570, lens barrels that stand upright to be parallel with each other are connected to each other by a rigid body and thus there is a case where vibration energy remains for a long period of time while not being dampened. With regard to this, even in a case where a damping material that can suppress vibration by converting deformation into heat energy is applied, a vibration control effect cannot be achieved for a vibration mode in which lens barrels are tilted in an out-of-plane direction with respect to a plane formed by central axes of two lens barrels.

Hereinafter, a charged particle beam apparatus and a vibration damper for a charged particle beam apparatus, an object of which is to efficiently suppress vibration of a column including a plurality of lens barrels, will be described.

In order to achieve the above-described object, an embodiment of the invention proposes a charged particle beam apparatus which includes a first charged particle beam apparatus column that surrounds a first charged particle passage track through which charged particles pass, the charged particle beam apparatus including a second charged particle beam apparatus column that surrounds a second charged particle passage track which is positioned at a position different from that of the first charged particle passage track, and a connection member one end of which is attached to the first charged particle beam apparatus column and the other end is attached to the second charged particle beam apparatus column. The connection member includes a plurality of plate-shaped members and a viscoelastic sheet which is interposed between the plurality of plate-shaped members.

In addition, in order to achieve the above-described object, another embodiment of the invention proposes a vibration damper for a charged particle beam apparatus which connects a first charged particle beam apparatus column and a second charged particle beam apparatus column, the vibration damper including a connection member one end of which is attached to the first charged particle beam apparatus column and the other end is attached to the second charged particle beam apparatus column. The connection member includes a plurality of plate-shaped members and a viscoelastic sheet which is interposed between the plurality of plate-shaped members.

According to the above-described configurations, it is possible to suppress vibration of a plurality of columns with a relatively simple structure.

BRIEF DESCRIPTION OF THE DRAWINGS

FIG. 10 is a view illustrating an example in which a thermal insulating member is disposed between a connection member having a vibration control effect and a lens barrel.

DETAILED DESCRIPTION OF THE INVENTION

Figure 1:
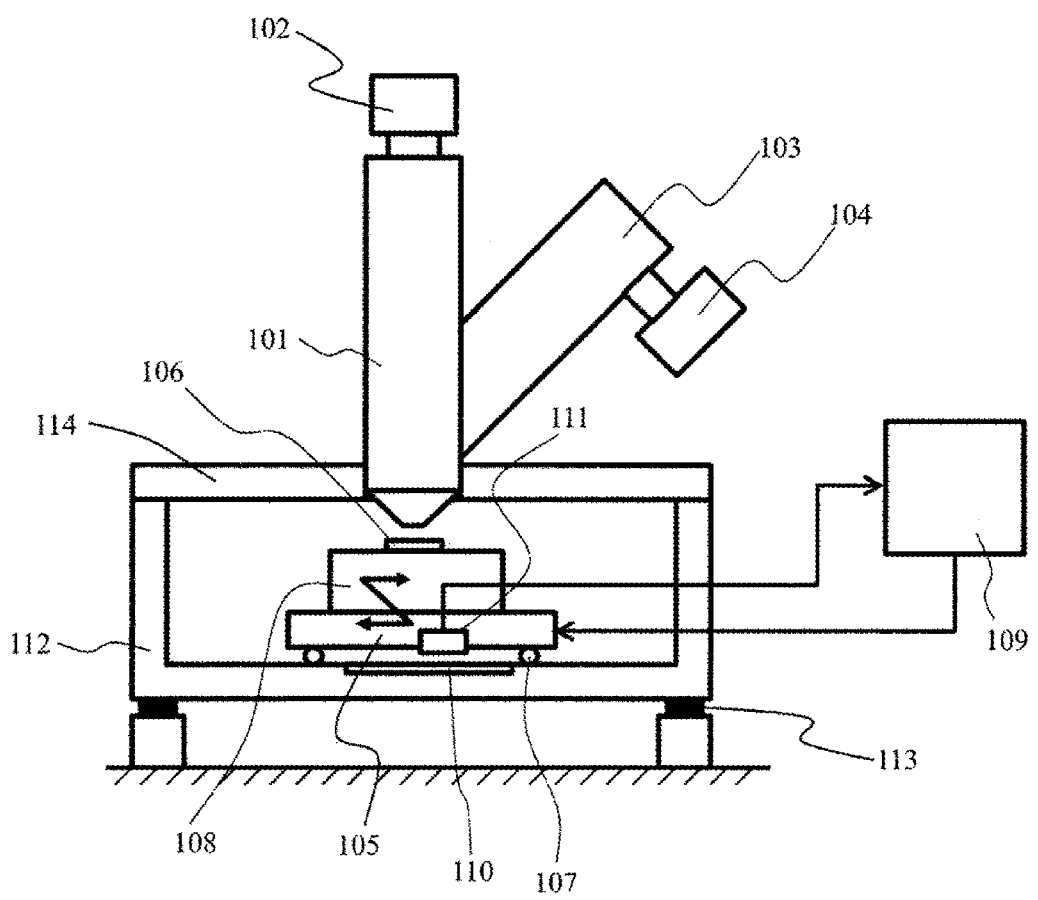
FIG. 1 is a view illustrating an example of a charged particle beam apparatus including two lens barrels.

Along with miniaturization of semiconductor elements in recent years, precision enhancement corresponding to the miniaturization is required not only for manufacturing apparatuses but also for inspection apparatuses and evaluation apparatuses. Examples of the inspection apparatuses and evaluation apparatuses include a charged particle beam apparatus provided with a plurality of columns. For example, there is a charged particle beam apparatus that includes a first charged particle beam column and a second charged particle beam column. The first charged particle beam column includes a charged particle source and irradiates a sample with a charged particle beam and the second charged particle beam column includes a detector, which detects charged particles obtained on the basis of the irradiation with the charged particle beam, and an imaging element. In addition, there is a charged particle beam apparatus in which each column has a charged particle source and one column is used to emit a beam for processing (for example, a converged ion beam) and the other column is used to emit a beam for observation (for example, an electron beam), for example.

For example, in a case where an optical system for irradiation with a beam and an optical system for detection are in different columns, a vibration mode of the columns becomes complicated. Since the number of natural frequencies corresponds to the number of columns, it becomes difficult to suppress the influence of vibration on an observation image in comparison with an apparatus with only one column. Particularly, in a case where an optical system for irradiation with a beam and an optical system for detection are in different columns, since passage of charged particles in the optical system for irradiation and passage of charged particles in the optical system for detection occur at the same time, when both columns are different in vibration state, complicated image jitter occurs.

As an electron microscope for detecting a defect in a semiconductor wafer, there is a mirror projection electron microscope (hereinafter, referred to as an MPJ electron microscope) having an internal defect detecting function. The MPJ electron microscope is one of apparatuses including two columns (an irradiation system and a detection system). Since a negative voltage which is equal to or greater than the acceleration energy of the electron beam is applied to the sample, the electron beam with which the sample is irradiated cannot reach the sample and becomes a mirror electron which is reflected toward the imaging element in the detection system.

In a case where the sample is evaluated using the MPJ, the defect detection accuracy is greatly influenced by image jitter which occurs due to vibration of the column. Particularly, in an apparatus in which a column is divided into a plurality of lens barrels in an electronic optical system and a detector as in the MPJ, since the vibration mode of the column becomes complicated and there are a plurality of natural frequencies, deterioration in image quality of an observation image due to vibration is likely to occur.

In the following examples, a vibration control structure, an object of which is to improve the image quality of an observation image or to improve a defect detection accuracy, will be described.

In the following examples, a charged particle beam apparatus, which includes a plurality of lens barrels of a lens barrel A that surrounds a charged particle passage track and a lens barrel B that surrounds a charged particle passage track which is positioned at a position different from that of the charged particle passage track in the lens barrel A, will be described. The charged particle beam apparatus further includes a vibration control member (a connection member) one end of which is attached to the lens barrel A and the other end is attached to the lens barrel B, the vibration control member includes a viscoelastic sheet and a plurality of supporting plates (plate-shaped members) holding the sheet, and the viscoelastic sheet is disposed to be perpendicular to the lens barrel.

According to the above-described configuration, it is possible to greatly suppress a machine difference in image quality and defect detection accuracy between apparatuses and to greatly suppress a change in image quality and defect detection accuracy after maintenance by suppressing vibration of a column in an apparatus, which includes a plurality of lens barrels, with a simple structure.

EXAMPLE 1

The following example is related to a vibration control structure of a column including a plurality of lens barrels and to a column vibration control structure including a vibration control member that connects a plurality of lens barrels to each other. Since the vibration control member is configured to connect the lens barrels, into which the column branches, to each other, the vibration control member will be described as a vibration damper for a branching column in the following description.

The vibration damper for a branching column includes a fixation portion fixed to the plurality of lens barrels, a plurality of viscoelastic sheets dampening vibration, and the supporting plate supporting the viscoelastic sheets. A plane including central axes of the lens barrel A and the lens barrel B includes a normal line to sheet surfaces of the viscoelastic sheets.

According to the above-described configuration, there is provided a column vibration control structure which suppresses an environmental sound or vibration of a column due to a movement of a stage in a column including a plurality of lens barrels and can improve the image quality of an observation image, defect detection accuracy, or throughput.

Particularly, in a case where a plurality of columns included in a charged particle beam apparatus, in which a direction in which an optical axis of one column extends is inclined with respect to a direction in which an optical axis of the other column extends, are connected to each other via the above-described damper as in this example, when the one column and the other column vibrate in different manners, shearing deformation of the viscoelastic sheet occurs and a vibration difference between both columns is converted into heat energy. Therefore, it is possible to suppress a difference in vibration between both columns. Meanwhile, in a case where the plurality of columns are supported to each other using the above-described connection member, vibrations of the plurality of columns can be synchronized with each other. Since it is possible to propagate vibration with a relative low frequency to some extent and to suppress propagation of vibration with a high frequency, it is possible to cause the other column to be inclined in accordance with an inclination of the one column so that a difference in vibration between both columns is suppressed. As a result of this, it is possible to suppress image misalignment due to an inclination of the column and to suppress propagation of vibration from the one column to the other column.

With reference to FIG. 1, an example of the charged particle beam apparatus will be described. Here, as an example of the charged particle beam apparatus, an example of a mirror projection electron microscope (hereinafter, the MPJ electron microscope) will be described. In the MPJ electron microscope, a defect on a wafer 106 is imaged, evaluated, and classified. On a sample chamber 112, an electronic optical lens barrel 103 and an imaging lens barrel 101 are mounted. The electronic optical lens barrel 103 irradiates the wafer 106 with an electron beam having a certain width and a reflected electron passes through the imaging lens barrel 101 and forms an image in a CCD camera 102.

In the sample chamber 112, a stage 105 is mounted and the wafer 106, which is an observation target, is mounted on the stage 105. The stage 105 is supported by a guide 107, the current position of the stage 105 is measured with an encoder head 111 reading a linear scale 110, and the stage 105 is controlled by a controller 109.

An ion pump 104 or the like is installed to the electronic optical lens barrel 103 and the mass of the electronic optical lens barrel 103 is approximately equal to that of the imaging lens barrel 101. Natural frequencies of the two lens barrels are also approximately equal to each other (several tens of Hz order). Therefore, in order to suppress image jitter due to residual vibration at the time of operation of the stage 105 or image jitter due to external disturbance, it is necessary to suppress vibration of both of the electronic optical lens barrel 103 and the imaging lens barrel 101.

Figure 2A:
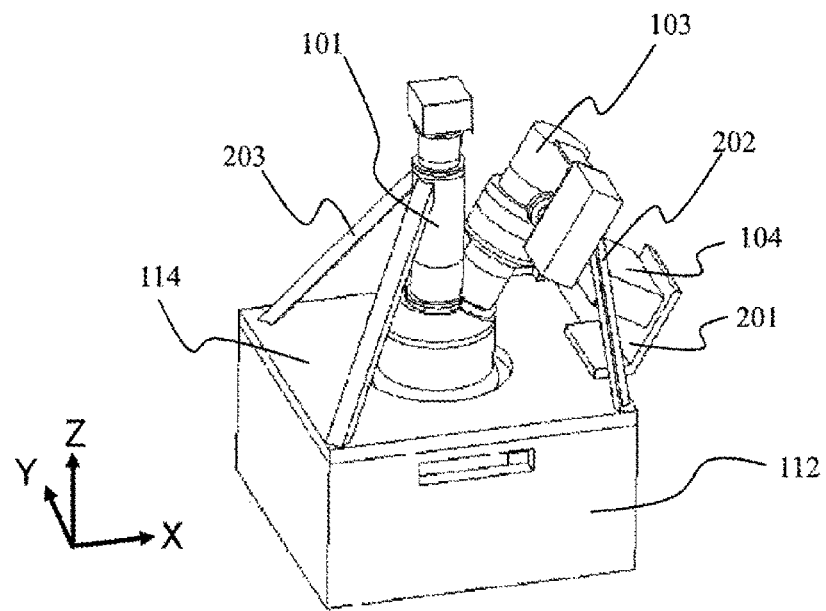
FIGS. 2A and 2B are views illustrating examples of the charged particle beam apparatus including a vibration control structure.

FIG. 2A is a view illustrating an electron microscope in which a vacuum chamber of the electron microscope and columns are connected to each other via a supporting member. The electron microscope in FIG. 2A is an MPJ microscope including two columns. An electronic optical system supporting structure 202 and an ion pump supporting structure 201 are used to suppress vibration in a tilt mode of the electronic optical lens barrel 103. Furthermore, an imaging system supporting structure 203 is used to suppress vibration in a tilt mode of the imaging lens barrel 101.

In an example in FIG. 2A, two optical system supporting structures 202 are needed to cause the optical system supporting structures 202 to effectively operate with respect to vibration in an X direction and a Y direction of the electronic optical lens barrel 103. Similarly, two imaging system supporting structures 203 are needed to cause the imaging system supporting structures 203 to operate in the X direction and the Y direction. Therefore, four supporting structures are needed in total. In addition, since the temperature of the ion pump is high at the time of baking after chip replacement, the ion pump supporting structure 201 is needed to be separated from the ion pump 104 and the ion pump supporting structure 201 is needed to be reattached after the baking. It is difficult to secure the attachment reproducibility at the time of the reattachment and vibration characteristics before the baking and vibration characteristics after the baking become different from each other. In addition, since the ion pump supporting structure 201 and the electronic optical system supporting structure 202 are large-sized structure members, the ion pump supporting structure 201 and the electronic optical system supporting structure 202 are manufactured using a lot of plate metals in consideration of costs. Therefore, the dimensional accuracy of each component is low and there are significant individual differences in influence on vibration characteristics even in a case where the assembly work is constant. In addition, in a case where the processing accuracy is improved to eliminate the assembly reproducibility and individual differences as much as possible, it is necessary to cut or grind large machined parts, which is difficult to realize in terms of cost.

Figure 2B:
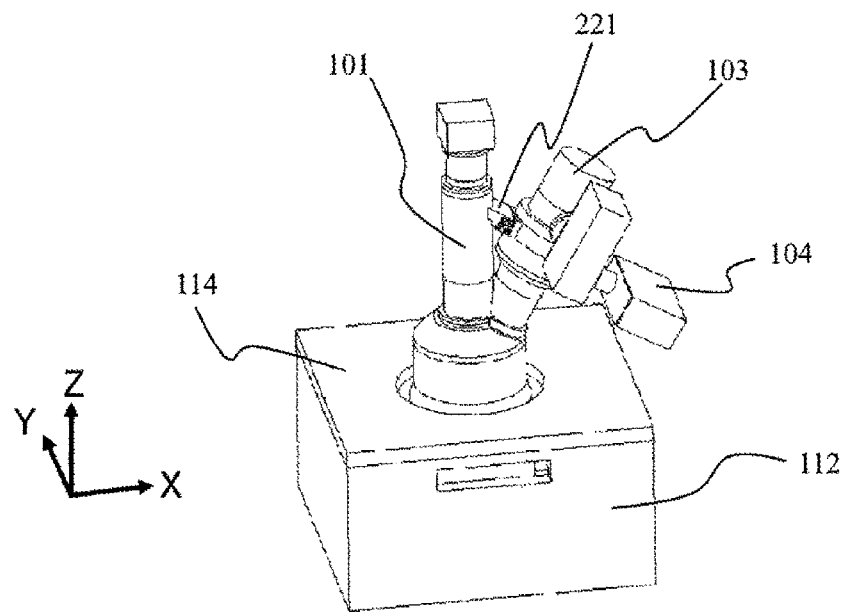

FIG. 2B is a view illustrating an example of the charged particle beam apparatus in which the two columns are connected using a supporting member which is suitable for vibration suppression. The electronic optical lens barrel 103 and the imaging lens barrel 101 are connected to each other via a supporting structure 221. The supporting structure 221 is effective with respect to both of vibration in the X direction and vibration in the Y direction for vibration in the tilt mode of both of the imaging lens barrel and the electronic optical lens barrel. In addition, it is not necessary to detach the supporting structure 221 at the time of the baking or the like and a change in vibration characteristic due to attachment reproducibility is not a problem. In addition, since the number of components is small, a machine difference due to the processing accuracy of a component is unlikely to be generated. Furthermore, since the structure is compact, the supporting structure 221 can be realized at low cost even if it is manufactured using machined parts with a high accuracy.

Figure 3A:
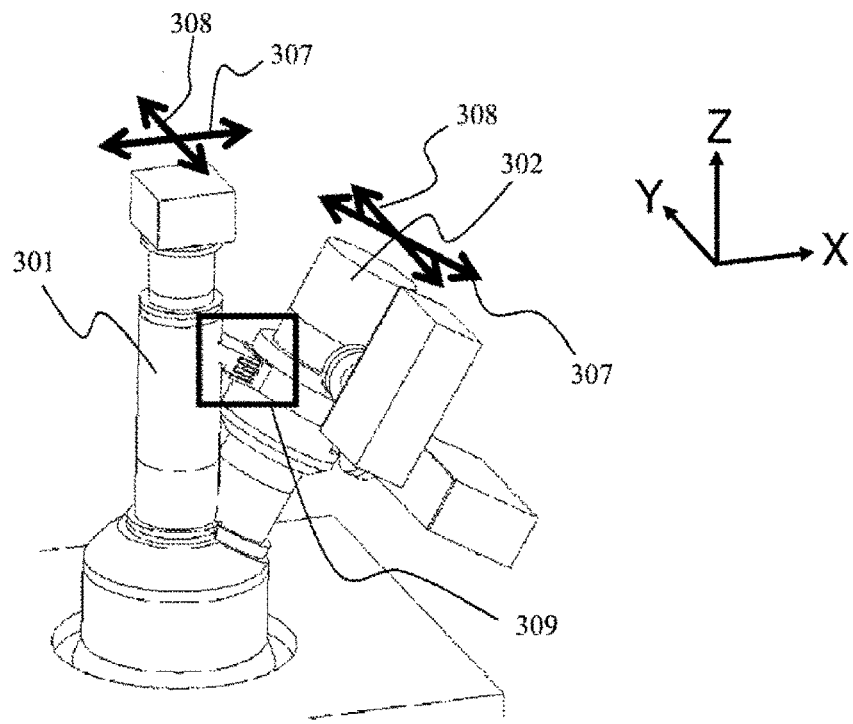
FIGS. 3A and 3B are views illustrating an example of the charged particle beam apparatus in which a connection member that connects a plurality of lens barrels is used as the vibration control structure.
Figure 3B:
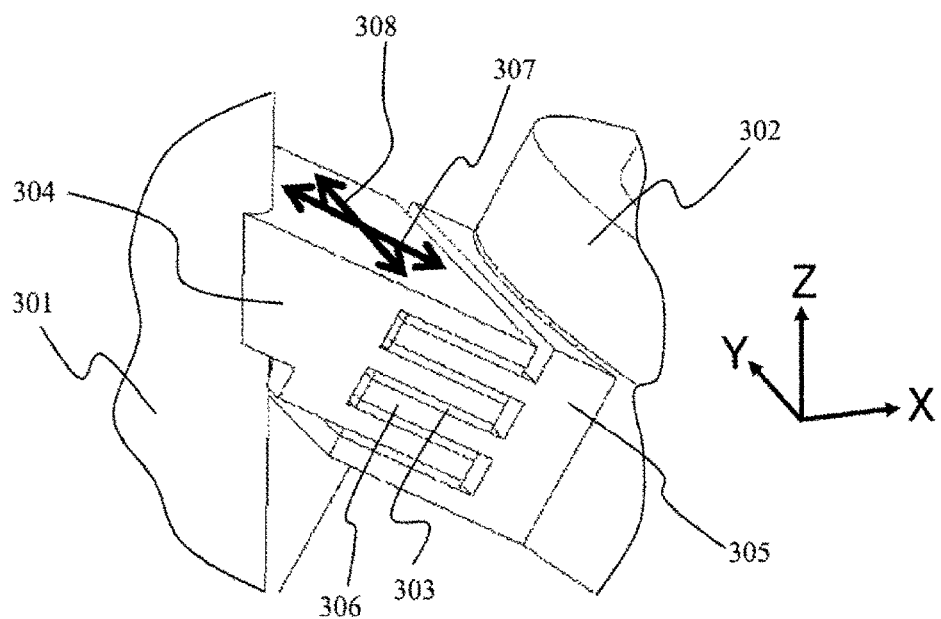

With reference to FIGS. 3A to 3C and FIG. 15, a configuration of the column vibration control structure which connects the two columns to each other is illustrated in detail. FIG. 3A illustrates an electron microscope including a supporting member having a vibration control effect and FIG. 3B is an enlarged view of the supporting member (a range 309). A fixation portion 304 is fixed to an imaging lens barrel 301 and a fixation portion 305 is fixed to an electronic optical lens barrel. A plurality of viscoelastic sheets 303 are disposed between the fixation portion 304 and the fixation portion 305. In this example, the viscoelastic sheets 303 are disposed to be perpendicular to the electronic optical lens barrel. However, the viscoelastic sheets 303 may be disposed to be perpendicular to the imaging lens barrel 301. In addition, the viscoelastic sheets 303 may be disposed in other manners as long as a normal line to a sheet surface of the viscoelastic sheet coincides with a plane formed by the central axes of the electronic optical lens barrel and the imaging lens barrel. Accordingly, it is possible to dampen vibration since shearing deformation of the viscoelastic sheet occurs when any of the electronic optical lens barrel and the imaging lens barrel vibrates in the X direction and the Y direction. For example, in a case where the lens barrel 301 vibrates in a direction 307, shearing deformation of the viscoelastic sheet 303 in the direction 307 occurs. In a case where the lens barrel 302 vibrates in a direction 308, shearing deformation of the viscoelastic sheet 303 in the direction 308 occurs. The same applies to a case where the lens barrel 302 vibrates.

Figure 15:
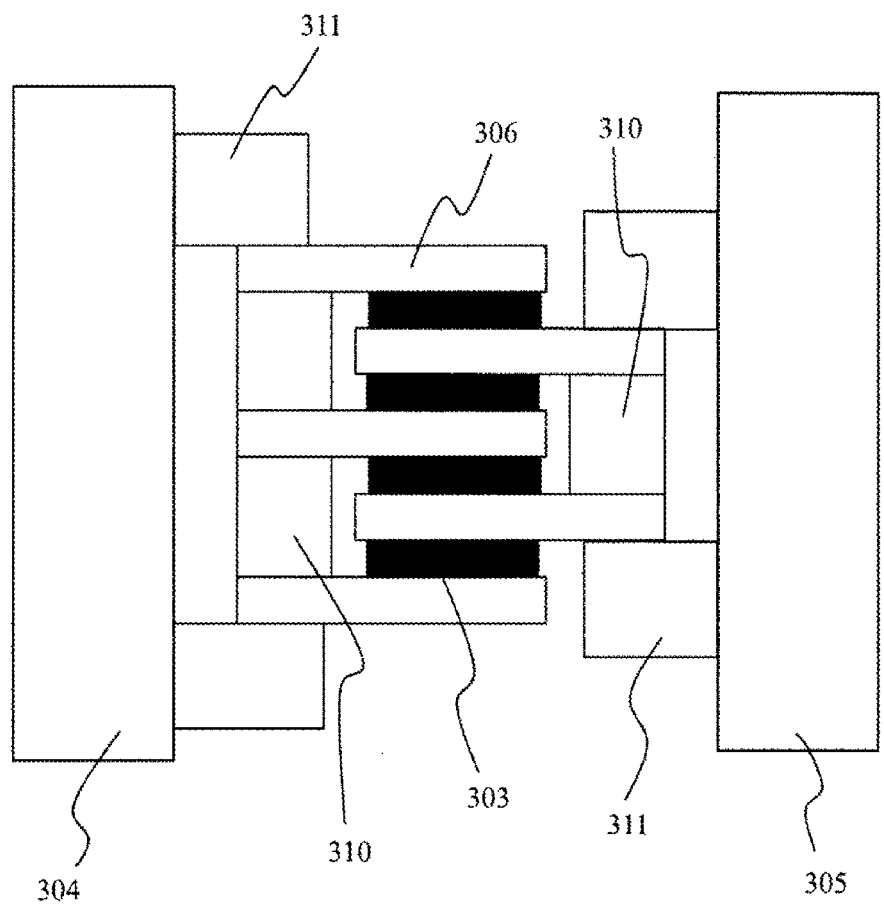
FIG. 15 is a view illustrating an example of the vibration control structure (the connection member having the vibration control effect and a vibration damper).

FIG. 15 is a view schematically illustrating the vibration damper. The viscoelastic sheet 303 is bonded to a supporting plate 306 (a plate-shaped member) and a spacer 310 is interposed between the supporting plates 306 and is fixed to the fixation portion 304 or the fixation portion 305 via a connection member 311. Furthermore, the fixation portion 304 and the fixation portion 305 are fixed to respective lens barrels. In addition, the widest surface of the viscoelastic sheet 303 and the supporting plate 306 are bonded to each other. Such a configuration is effective particularly for improvement of a dampening effect due to the shear stress. In addition, since a viscoelastic member is formed into a sheet-like shape, a plurality of viscoelastic sheets can be disposed being stacked as illustrated in FIG. 15 and a high dampening effect can be expected. Furthermore, the viscoelastic sheets are made of, for example, rubber or resin. For the viscoelastic sheets, a material, the viscosity of which is relatively higher than that of the supporting plate 306 that is formed of stainless steel or the like and the elastic modulus is relatively lower than that of the supporting plate 306, is used. It is desirable that a viscoelastic sheet the shear storage modulus of which is 0.5 to 10 MPa (the shear storage modulus of stainless steel is 77 GPa (=77,000 MPa)) and the loss factor is equal to or greater than 0.5 (0.5 to 1.5 (the loss factor of stainless steel is 0.01 to 0.02)) is used as the above-described viscoelastic sheet.

Figure 4A:
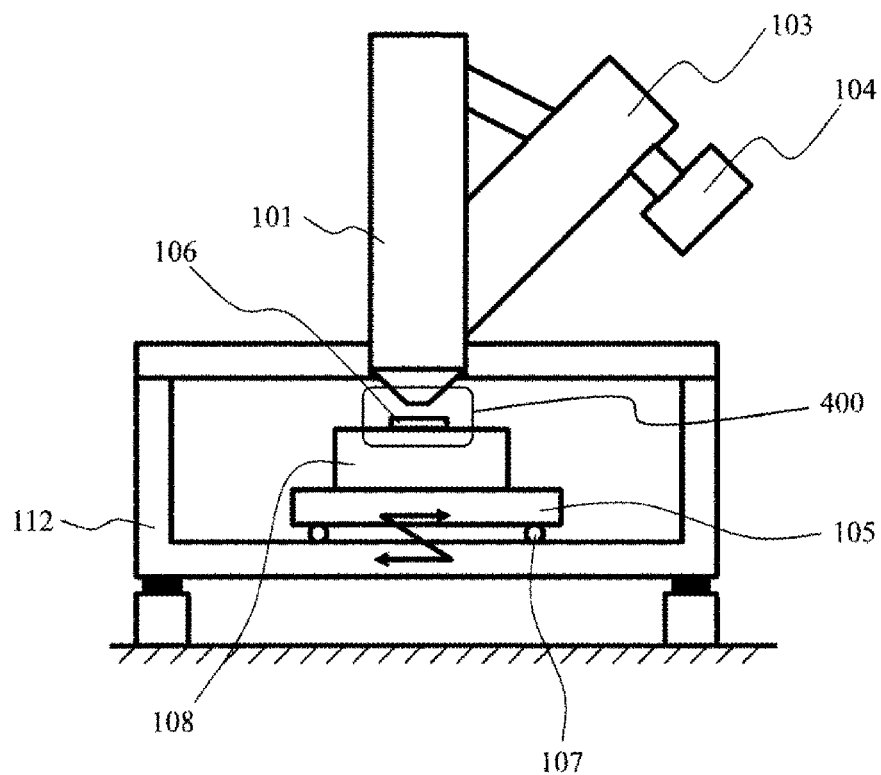
FIGS. 4A and 4B are views for explaining how image jitter occurs.
Figure 4B:
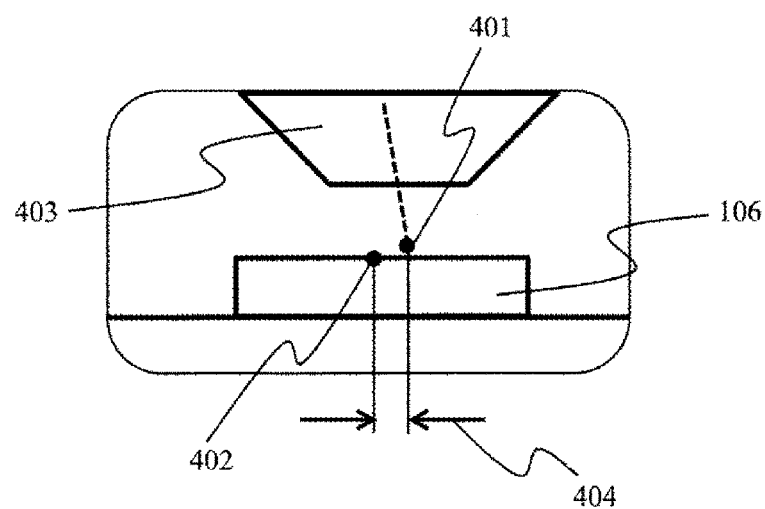

With reference to FIGS. 4A and 4B, how the image jitter in the MPJ electron microscope occurs will be described. An enlarged view of a range 400 in FIG. 4A is FIG. 4B. When the electronic optical lens barrel is tilted, a positional relationship between an application point 401 of the electron beam and an observation target point 402 on the wafer is deviated and a deviation amount 404 is the amplitude of vibration.

Figure 5A:
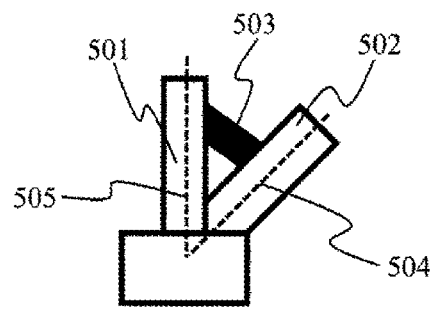
FIGS. 5A to 5E are views illustrating how vibration is suppressed by the vibration control structure.

With reference to FIGS. 5A to 5E, how the vibration control structure illustrated in FIG. 3B suppresses vibration of the electronic optical lens barrel and the imaging lens barrel will be described. FIG. 5A is a view for explaining arrangement of each column constituting the MPJ electron microscope. An electron beam is emitted along a central axis 504 (an optical axis) of the electronic optical lens barrel and the electron beam is reflected by a retarding field formed above the sample. A mirror electron reflected on the sample travels toward an imaging element, which is provided in the imaging lens barrel, along a central axis 505 of the imaging lens barrel and is detected by the imaging element. Therefore, if an intersection point between the axis 504 and the axis 505 is deviated, a positional relationship between a point on the sample which is irradiated with an electron and a point at which a reflection electron detected in the imaging system is generated is deviated and thus the image jitter occurs.

Figure 5B:
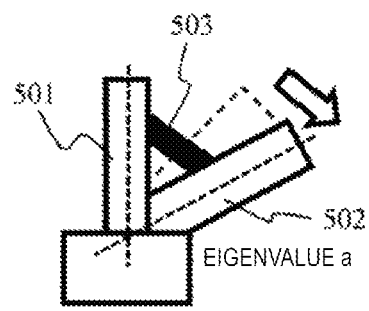
Figure 5C:
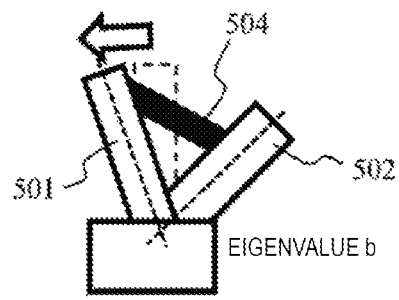
Figure 5D:
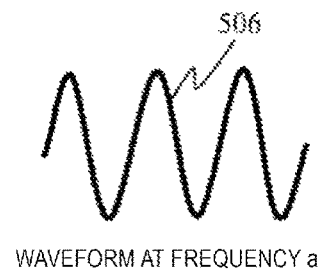
Figure 5E:
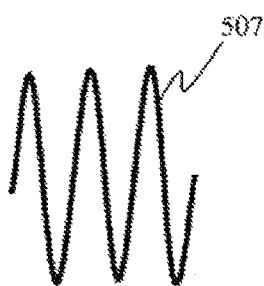

A vibration mode in which the lens barrels are tilted as illustrated in FIGS. 5B and 5C will be discussed. In an assumption that a displacement of an electronic optical lens barrel 502 in FIG. 5B is represented by X1 and a displacement of an imaging lens barrel 501 in FIG. 5C is represented by X2, if X1 and X2 correspond to vibration with a sine wave as illustrated in FIGS. 5D and 5E respectively, X1 and X2 are represented by $X1=A\times\sin(2\pi\times fa\times t)$ and $X2=B\times\sin(2\pi\times fb\times t)$. A represents the amplitude of the electronic optical lens barrel 502, B represents the amplitude of the imaging lens barrel 501, fa represents the natural frequency of the electronic optical lens barrel 502, and fb represents the natural frequency of the imaging lens barrel 501. Hereinafter, a relative displacement X3 between the two lens barrels is represented by $X3=X1-X2=A\times\sin(2\pi\times fa\times t)-B\times\sin(2\pi\times fb\times t)=A(\sin(2\pi\times fa\times t)-\sin(2\pi\times fb\times t))-(B-A)\times\sin(2\pi\times fb\times t)=2A\cos(\pi(fa+fb)t)\times\sin(\pi(fa-fb)t)-(B-A)\sin(2\pi\times fb\times t)$.

Here, shearing deformation of the viscoelastic sheet of a vibration control member 503 is proportional to the magnitude of X3. Therefore, as X3 increases, the vibration energy is largely dampened. In addition, the dampened energy is proportional to the strain energy of the viscoelastic sheet and the strain energy is proportional to the square of shear strain. Therefore, it can be said that the magnitude of X3 is important to vibration suppression. Here, if $B \neq A$ or $fa \neq fb$ is satisfied, since X3 does not become 0, a dampening effect is obtained and vibration is suppressed.

The above-described conditions indicate that the above-described vibration control structure is effective if the electronic optical lens barrel and the imaging lens barrel do not have the same eigenvalue and do not vibrate with the same amplitude. In fact, the two lens barrels do not have the same eigenvalue. Even in a case where the two lens barrels have the same eigenvalue, when there is a difference in amplitude or phase, X3 does not become 0 and the dampening effect works.

Therefore, it can be said that the vibration control structure is effective regardless of which of the imaging system and the electronic optical system it tilted. In addition, the dampening effect is particularly great in a case where the imaging system and the electronic optical system relatively are tilted in which X3 becomes great and it can be said that the vibration control structure is effective for a vibration mode with a great image jitter amount.

Figure 6:
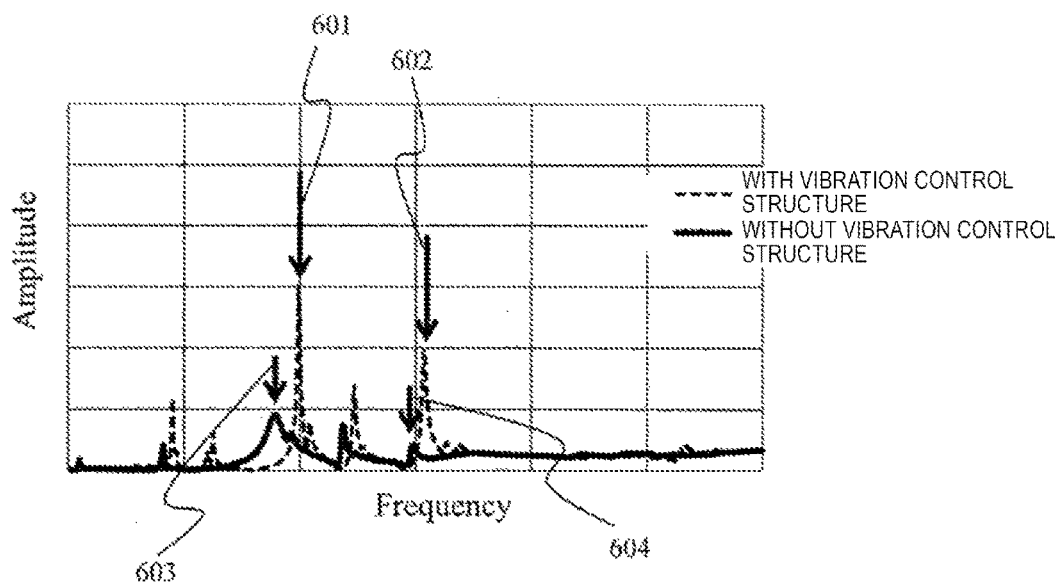
FIG. 6 is a diagram illustrating the result of an image jitter amount analysis.

With reference to FIG. 6, the result of image jitter amount analysis of an apparatus which uses a finite element method will be described. Relative displacement of an electron application point extending from a distal end of an object lens and an observation target point on the wafer pertaining to a case where the stage is subjected to excitation in the X direction is used as an image jitter amount and the horizontal axis represents the frequency and the vertical axis represents the image jitter amplitude per unit excitation force. With regard to the vibration control structure, a case where the vibration control structure is not provided and a case where the proposed vibration control structure is provided are compared with each other.

The result of the analysis indicates that an image jitter peak 601 pertaining to a case where the electronic optical lens barrel is tilted in the X direction as illustrated in FIG. 5B and a peak 602 pertaining to a case where the imaging lens barrel is tilted in the X direction as illustrated in FIG. 5C are dampened and decreased to a peak 603 and a peak 604, respectively.

Figure 7:
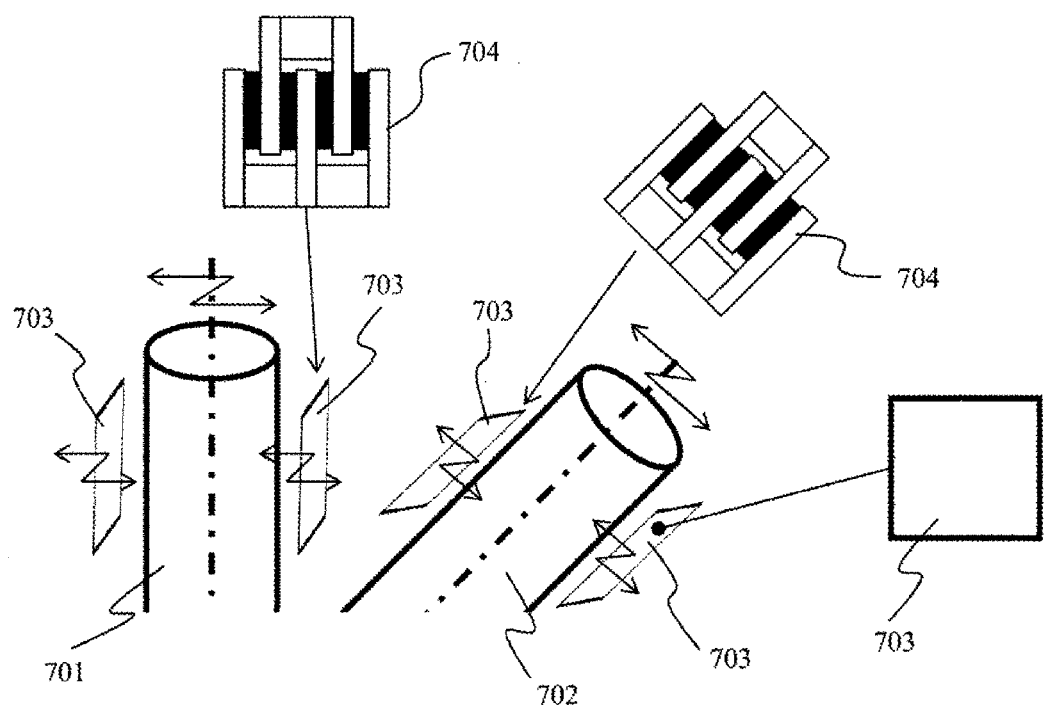
FIG. 7 is a view illustrating a relationship between directions in which optical axes of the plurality of lens barrels extend and a direction in which a surface of a viscoelastic sheet extends.

With reference to FIG. 7, an influence of a positional relationship between the plurality of lens barrels and a viscoelastic sheet 703 on the dampening effect will be described. In a case where dampers are attached to a lens barrel 701 and a lens barrel 702 being oriented as illustrated by schematic FIG. 704, the viscoelastic sheet is disposed as illustrated by a numeral 703 when only the orientation of the viscoelastic sheet is considered. FIG. 7 illustrates a case where normal directions (normal lines to tangent lines (straight lines) to cylinders) to cylindrical surfaces (outer surfaces of the column) of the lens barrel 701 and the lens barrel 702 or a line orthogonal to the ideal optical axis of the lens barrel coincides with a normal direction to a sheet surface of the viscoelastic sheet 703. In this case, since the shearing deformation of the sheet does not occur regardless of which lens barrel is tilted, the dampening effect cannot be obtained.

Figure 8:
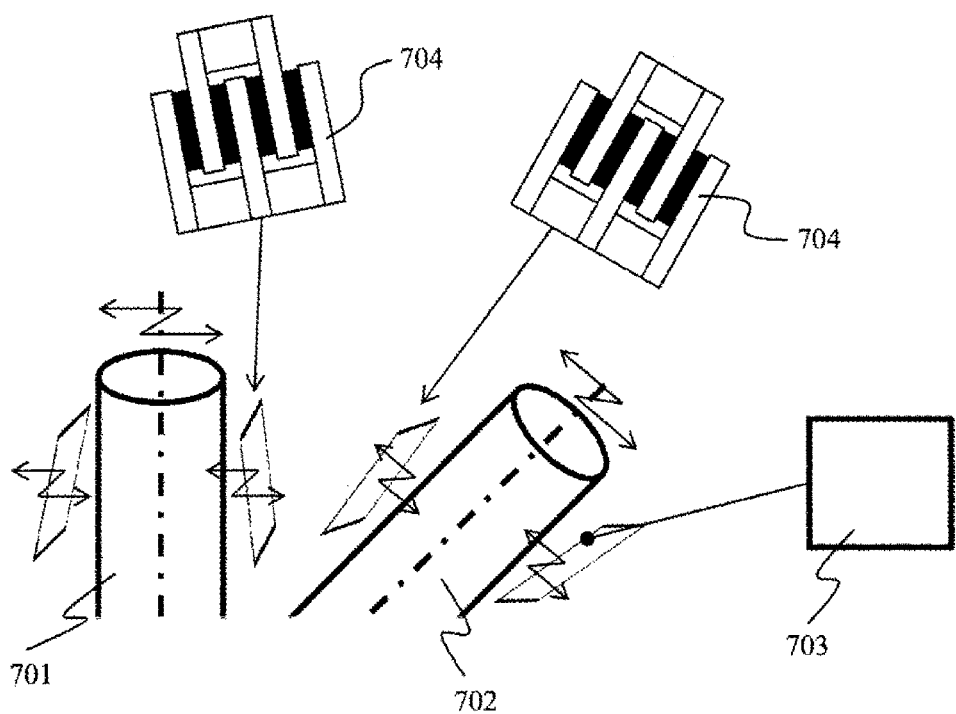
FIG. 8 is a view illustrating a relationship between directions in which the optical axes of the plurality of lens barrels extend and a direction in which the surface of the viscoelastic sheet extends.

With reference to FIG. 8, an example of a case where the viscoelastic sheet faces the plurality of lens barrels will be described. FIG. 8 illustrates a case where the normal directions to the cylindrical surfaces of the lens barrel 701 and the lens barrel 702 and a normal direction to a sheet surface of the viscoelastic sheet face each other. In other words, FIG. 8 illustrates a state where the normal directions to the cylindrical surfaces and the normal direction to the sheet surface (the widest surface of the viscoelastic sheet) intersect each other or are skew. In this case, since the shearing deformation occurs, an effect of dampening vibration can be obtained. However, since only a small shearing deformation occurs regardless of which lens barrel is tilted, the dampening effect is small.

Figure 9:
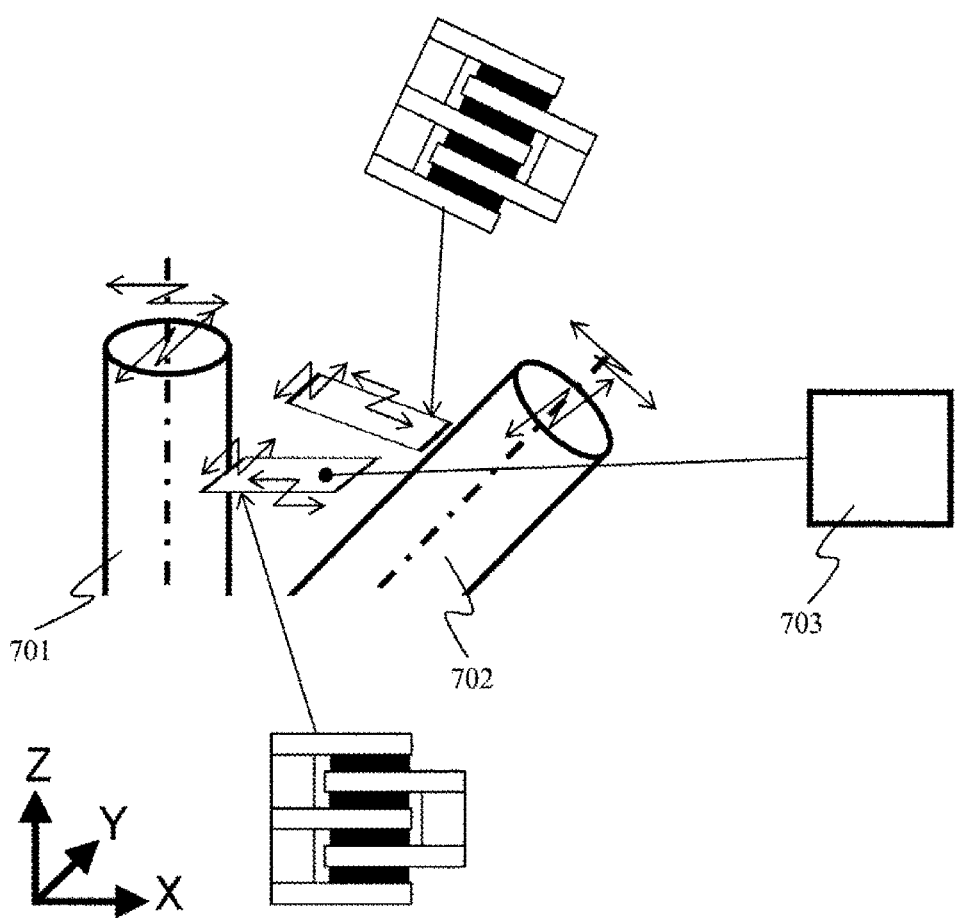
FIG. 9 is a view illustrating a relationship between directions in which the optical axes of the plurality of lens barrels extend and a direction in which the surface of the viscoelastic sheet extends.

With reference to FIG. 9, an example of ideal arrangement of the lens barrels and the viscoelastic sheet will be described. In this example, the normal line to the sheet surface of the viscoelastic sheet is present on a plane formed by the central axes of the lens barrel 701 and the lens barrel 702. More specifically, the connection member between the lens barrels is disposed such that the normal line to the sheet surface (the widest surface of the plate-shaped viscoelastic sheet) extends in a plane two sides of which are the central axis (the optical axis) of the lens barrel 701 and the central axis (the optical axis) of the lens barrel 702 and is positioned between the two sides. The viscoelastic sheet is installed such that the normal line of the sheet surface is parallel to the central axis of the lens barrel 701, the normal line of the sheet surface is parallel to the central axis of the lens barrel 702, or the normal line of the sheet surface is positioned inside an angle between the central axes of both lens barrels. In this case, the shearing deformation of the viscoelastic sheet occurs regardless whether the lens barrel 701 is tilted in the X direction or the Y direction and vibration is efficiently dampened. In addition, also in a case where the lens barrel 702 is tilted in the X direction and the Y direction, the shearing deformation of the viscoelastic sheet occurs and vibration is dampened.

EXAMPLE 2

With reference to FIG. 10, an example of a case where a thermal insulating member is added as the fixation portion, which connects the supporting plate supporting the shape of the viscoelastic sheet to the lens barrel, will be described. FIG. 10 is a view illustrating another example of the connection member illustrated in FIGS. 3A and 3B. In some times, the temperature of the electronic optical lens barrel becomes high due to the baking and the temperature of the electronic optical lens barrel may exceed the heat resisting temperature of the viscoelastic sheet or the heat resisting temperature of a bonding agent which fixes the viscoelastic sheet to the supporting plate depending on the type of the electronic optical lens barrel. In such a case, if a thermal insulating member (a member the heat resistance of which is relatively higher than that of a metal portion of the connection member (for example, stainless steel) and the thermal conductivity is low) is used with respect to a fixation portion 1004, it is possible to prevent peeling-off of the viscoelastic sheet due to heat. It is desirable that a resin material or a material such as ceramic the thermal conductivity of which is 0.1 to 0.4 [W/mk] (the thermal conductivity of stainless steel is 16.7 to 20.9 [W/mk]) is used as the thermal insulating member.

EXAMPLE 3

Figure 11:
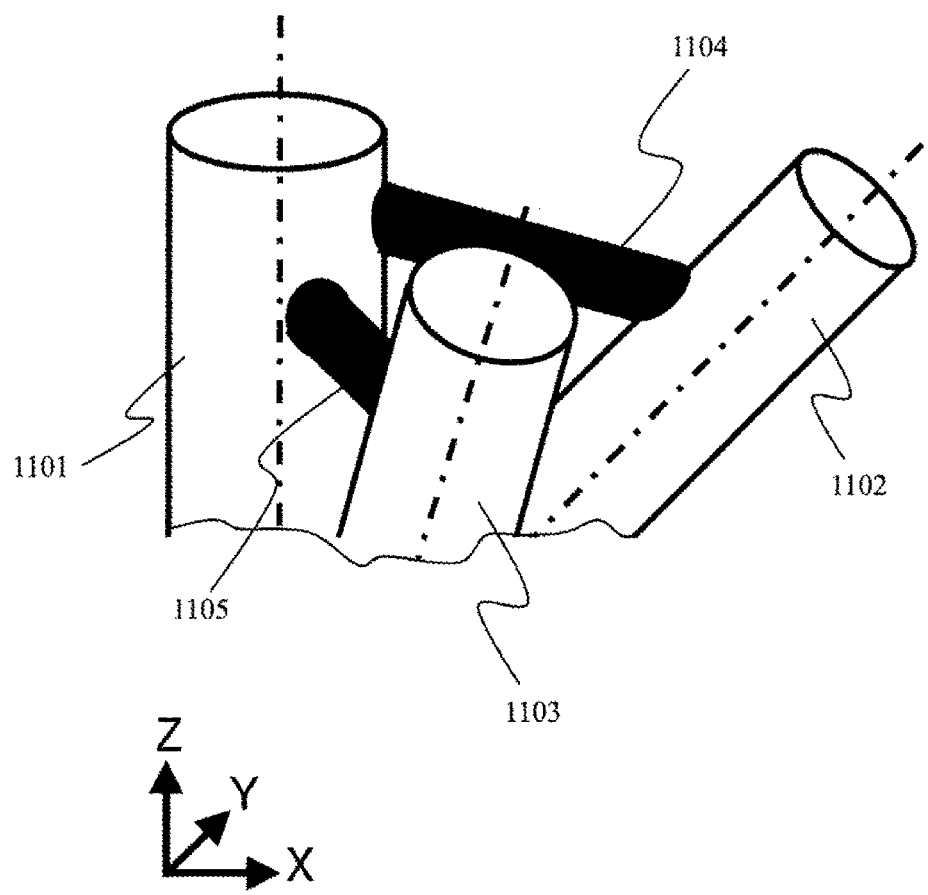
FIG. 11 is a view illustrating an example in which the vibration control structures are installed to the charged particle beam apparatus including three lens barrels.

FIG. 11 is a view illustrating an example where the connection members (the vibration control structures) which connect lens barrels are applied to a charged particle beam apparatus with three lens barrels. In the case of an apparatus which includes three lens barrels of a lens barrel 1101, a lens barrel 1102, and a lens barrel 1103 and in which image jitter is influenced regardless of which lens barrel vibrates, it is possible to control vibration of the three lens barrels by installing a vibration control structure 1104 between the lens barrel 1101 and the lens barrel 1102 and installing a vibration control structure 1105 between the lens barrel 1101 and the lens barrel 1103.

Figure 12A:
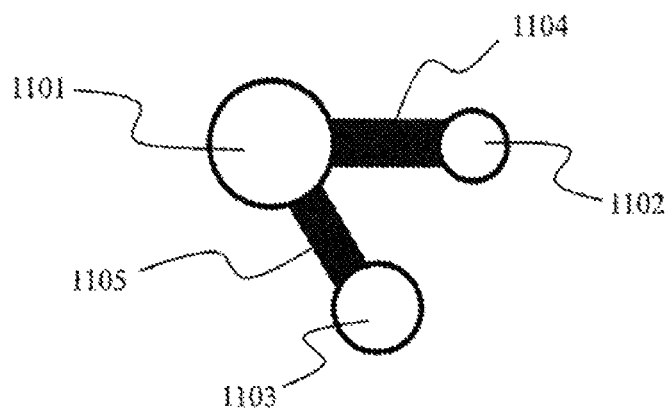
FIGS. 12A and 12B are views illustrating examples in which the vibration control structures are installed to the charged particle beam apparatus including three lens barrels.
Figure 12B:
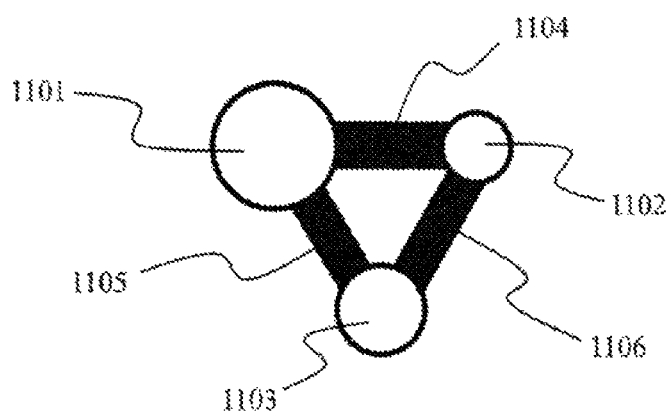

FIGS. 12A and 12B are views illustrating examples where the vibration control structure is applied to an apparatus with three lens barrels.

FIG. 12A is a view illustrating an example where two vibration control structures are applied such that one column is connected to two other columns as with FIG. 11. Aside from this, it is also possible to cope with a case where relative displacement of the lens barrel 1102 and the lens barrel 1103 causes a problem by installing a vibration control structure 1106 between the lens barrel 1102 and the lens barrel 1103 as illustrated in FIG. 12B.

EXAMPLE 4

Figure 13A:
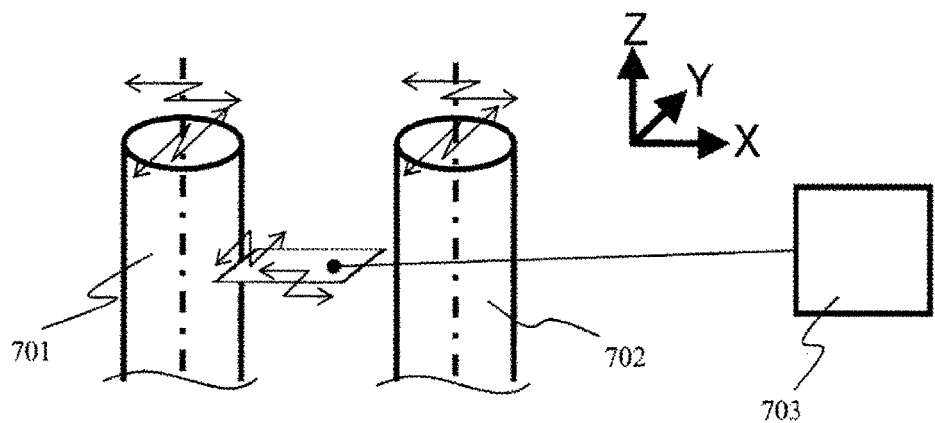
FIGS. 13A to 13C are views illustrating examples in which two lens barrels, optical axes of which are parallel to each other, are connected to each other using the connection member having the vibration control effect.
Figure 13B:
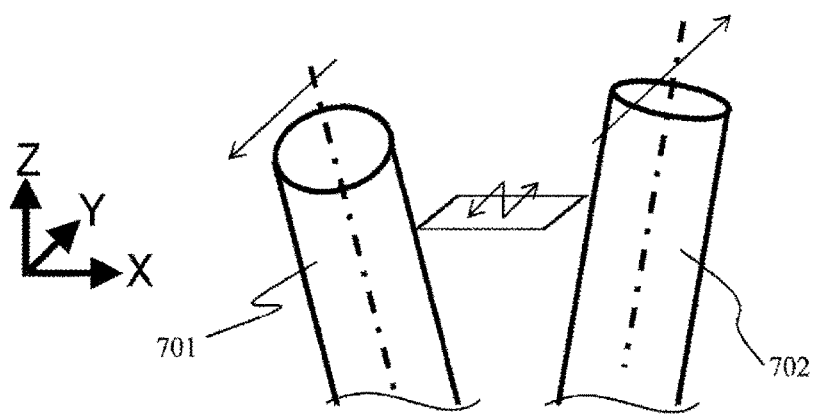
Figure 13C:
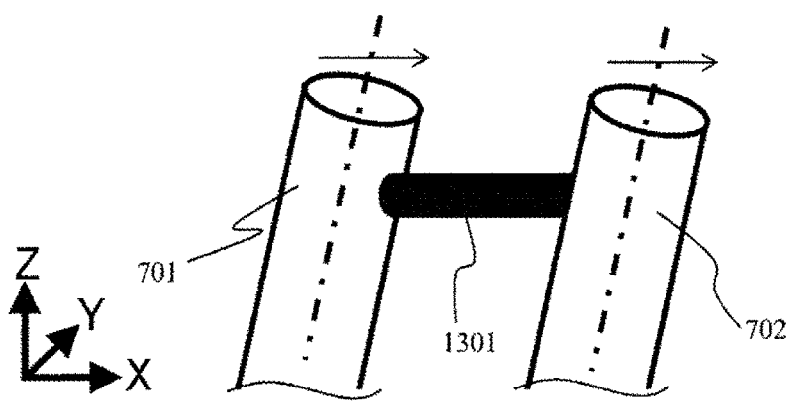

FIGS. 13A to 13C are views illustrating an example where the vibration control structure is applied to a column in which the lens barrels are disposed to be parallel to each other. However, in this case also, it is assumed that the lens barrel 701 and the lens barrel 702 are different in eigenvalue. A case where the lens barrels stand upright to be parallel to each other as illustrated in FIG. 13A and the viscoelastic sheet is disposed between the lens barrels will be discussed. In the case of the column in FIG. 13A, there is a vibration mode in which the lens barrel 701 and the lens barrel 702 are tilted in the opposite directions in the Y direction as illustrated in FIG. 13B. In such a vibration mode also, the shearing deformation of the viscoelastic sheet occurs. Therefore, it is possible to suppress vibration.

Figure 14A:
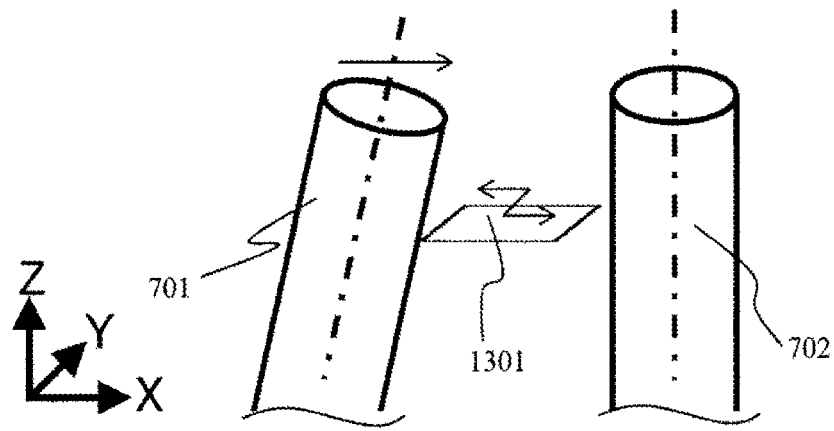
FIGS. 14A and 14B are views for explaining types of vibration of the two lens barrels, the optical axes of which are parallel to each other.
Figure 14B:
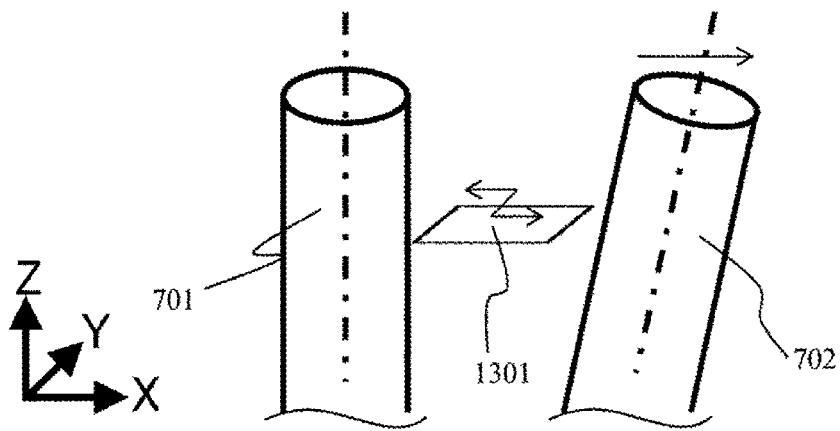

However, in a case where the lens barrels are tilted as in FIG. 13C and a connection member 1301 which connects the lens barrel 701 and the lens barrel 702 to each other is a rigid body, the lens barrel 701 and the lens barrel 702 are tilted at one natural frequency, the connection member 1301 is not deformed, and vibration is not dampened. On the other hand, when a viscoelastic body is used as the connection member 1301, a tilt mode in FIG. 13C becomes a vibration mode in which the lens barrel 701 and the lens barrel 702 are individually tilted as illustrated in FIGS. 14A and 14B and thus vibration is dampened.

In addition, in a case where the lens barrels are disposed not to be parallel to each other as in FIG. 13A but to be inclined with each other as in FIG. 9, a vibration mode in which the positional relationship between the central axes of the lens barrels is deviated as in FIGS. 13B and 13C is not generated.

Although the examples of the invention have been described above, it is to be understood for those skilled in the art that the present invention is not limited to the above-described examples, and that various modifications are possible within the scope of the invention described in the claims.

What is claimed is:

1. A charged particle beam apparatus which includes a first charged particle beam apparatus column that surrounds a first charged particle passage track through which charged particles pass, the charged particle beam apparatus comprising:
   a second charged particle beam apparatus column that surrounds a second charged particle passage track which is positioned at a position different from that of the first charged particle passage track; and
   a connection member one end of which is attached to the first charged particle beam apparatus column and the other end is attached to the second charged particle beam apparatus column,
   wherein the connection member includes a plurality of plate-shaped members and a viscoelastic sheet which is interposed between the plurality of plate-shaped members.

2. The charged particle beam apparatus according to claim 1,
   wherein the first charged particle beam apparatus column and the second charged particle beam apparatus column are relatively inclined with respect to each other.

3. The charged particle beam apparatus according to claim 1,
   wherein the viscoelastic sheet is disposed such that a normal line to a sheet surface of the viscoelastic sheet and normal lines to outer surfaces of the columns intersect each other or are skew.

4. The charged particle beam apparatus according to claim 1,
   wherein the viscoelastic sheet is disposed such that a normal line to a sheet surface of the viscoelastic sheet is parallel to the first charged particle passage track, is parallel to the second charged particle passage track, or lies inside an angle between the first charged particle passage track and the second charged particle passage track.

5. The charged particle beam apparatus according to claim 1,
   wherein the connection member includes a first plate-shaped member which is fixed to the first charged particle beam apparatus column, a second plate-shaped member which is fixed to the second charged particle beam apparatus column, and the viscoelastic sheet which is bonded to the first plate-shaped member and the second plate-shaped member while being interposed between the first plate-shaped member and the second plate-shaped member.

6. The charged particle beam apparatus according to claim 5,
   wherein the connection member includes a plurality of viscoelastic sheets and the first plate-shaped member and the second plate-shaped member are alternately disposed such that the viscoelastic sheets are interposed therebetween.

7. The charged particle beam apparatus according to claim 1,
   a member the thermal conductivity of which is relatively lower than that of the connection member is disposed at, at least one of a position between the first charged particle beam apparatus column and the connection member and a position between the second charged particle beam apparatus column and the connection member.

8. A vibration damper for a charged particle beam apparatus which connects a first charged particle beam apparatus column and a second charged particle beam apparatus column, the vibration damper comprising:
   a connection member one end of which is attached to the first charged particle beam apparatus column and the other end is attached to the second charged particle beam apparatus column,
   wherein the connection member includes a plurality of plate-shaped members and a viscoelastic sheet which is interposed between the plurality of plate-shaped members.

* * * * *